(12) United States Patent
Nakanishi

(10) Patent No.: US 7,030,516 B2
(45) Date of Patent: Apr. 18, 2006

(54) CONTROL APPARATUS

(75) Inventor: Mamoru Nakanishi, Mie (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 489 days.

(21) Appl. No.: 10/340,070

(22) Filed: Jan. 10, 2003

(65) Prior Publication Data

US 2003/0151313 A1 Aug. 14, 2003

(30) Foreign Application Priority Data

Feb. 14, 2002 (JP) ............................. 2002-036933

(51) Int. Cl.
*H01H 3/00* (2006.01)
(52) U.S. Cl. ..................................... 307/139
(58) Field of Classification Search ................ 307/139
See application file for complete search history.

(56) References Cited

U.S. PATENT DOCUMENTS 5,051,849 A * 9/1991 Fukushima et al. ........... 360/69
5,844,185 A 12/1998 Shih
6,388,343 B1 * 5/2002 Michigami et al. ......... 307/112

FOREIGN PATENT DOCUMENTS

JP 11301064 A 11/1999
JP 2000-157032 6/2000

* cited by examiner

*Primary Examiner*—Brian Sircus
*Assistant Examiner*—Dru Parries
(74) *Attorney, Agent, or Firm*—Oliff & Berridge, PLC

(57) ABSTRACT

A control apparatus has a momentary switch. In response to an operation performed on a momentary switch, a latch circuit (13) switches a latch output signal to be outputted to a microcomputer (11) from "high" to "low" and keeps the latch output signal "low". A capacitor (C) supplies an electric power to the latch circuit (13) when supply of the electric power is cut off. A reset circuit (15) sends a signal to the latch circuit (13) in response to an input of a high-level latch reset signal from the microcomputer (11) so that the latch circuit (13) switches the latch output signal from "low" to "high". If the latch output signal is "high" when the microcomputer (11) detects that the switch (SW) is operated, a transistor (Tr) is turned on under the control of the microcomputer (11). If the latch output signal is "low" when the microcomputer (11) detects that the switch (SW) is operated, the transistor (Tr) is turned off under the control of the microcomputer (11). The microcomputer (11) outputs the high-level latch reset signal to the reset circuit.

6 Claims, 7 Drawing Sheets

CONTROL APPARATUS

CROSS REFERENCE TO RELATED APPLICATION

This application claims priority to Japanese Patent Application No. 2002-036933 filed Feb. 14, 2002, which application is herein expressly incorporated by reference.

FIELD OF THE INVENTION

The present invention relates to a control apparatus for controlling an object in response to an operation performed on a momentary switch.

BACKGROUND OF THE INVENTION

FIG. 6 is a block diagram showing a conventional control apparatus. The control apparatus is used for a vehicle. As shown in FIG. 6, the control apparatus has a momentary switch SW and a microcomputer 101. The microcomputer 101 switches the control state of a to be-controlled object (for example, rear fog lamp) between a first control state (for example, state in which function is ON) and a second control state (for example, state in which function is OFF) each time the momentary switch SW is operated. More specifically, when the momentary switch SW is operated, the microcomputer 101 discriminates whether the operation is a first operation to turn on the function or a second operation to turn off the function. Each time the momentary switch SW is operated, as shown in FIG. 7, the microcomputer 101 switches the control state of a rear fog lamp 3 ON, OFF, ON, OFF, . . . through a switching transistor Tr. Therefore the microcomputer 101 controls the rear fog lamp 3 by always storing the operation state, where the function is ON by a first operation or where the function is OFF by a second operation, of the momentary switch SW.

The rear fog lamp 3, the transistor Tr, and an ignition switch 5 are mounted in series with a path 7. One end of the path 7 is connected to a power source line and other end is connected to the ground. Thus when the transistor Tr is turned on and off under the control of the microcomputer 101, with the ignition switch ON, the rear fog lamp 3 is turned on and off.

However, in the conventional control apparatus, when the supply of electric power to the microcomputer 101 is terminated because of a temporary (or instantaneously) interruption of supply of the electric power such as a battery exchange, disconnection of a power source line or some factor, information on the operation state of the momentary switch SW stored by the microcomputer 101 disappears. Thus, when the supply of the electric power is resumed, it is necessary to reset the control state of the rear fog lamp 3 to an initial state, for example, an off state.

Therefore when the supply of the electric power to the microcomputer 101 is interrupted instantaneously at a time T when the rear fog lamp 3 is ON as shown in FIG. 7, the microcomputer 101 resets (release of ON state) the control state of the rear fog lamp 3 to the OFF state. After the supply of the electric power is resumed, the rear fog lamp 3 is kept in the OFF state. To turn on the rear fog lamp 3, it is necessary to operate the momentary switch.

SUMMARY OF THE INVENTION

The present invention overcomes the drawbacks of the above-described situation. Accordingly, it is an object of the present invention to provide a control apparatus capable of holding an operation state set by a momentary switch, when the electric power to a microcomputer is terminated or interrupted.

The present invention provides the art with a control apparatus to alternately switch a control state of an object between a first control state and a second control state in response to an operation on a momentary switch. The control apparatus includes the momentary switch. A latch circuit operates, based on electric power supplied to it, in such a way as to switch a latch output signal from a first output state to a second output state. The latch circuit holds the second output state in response to the operation performed by the momentary switch. A reset circuit sends a signal to the latch circuit in response to an input of a latch reset signal. Accordingly, the latch circuit switches the latch output signal from the second output state to the first output state. A microcomputer, based on the electric power supplied to it, operates in such a way that if the latch output signal has the first output state when the momentary switch is operated, the microcomputer switches the control state of the object from the first control state to the second control state. If the latch output signal has the second output state when the momentary switch is operated, the microcomputer switches the control state of the object from the second control state to the first control state. The microcomputer also outputs the latch reset signal to the reset circuit. A capacitor is electrically connected to the power supply line. The capacitor supplies electric power to the latch circuit to hold an output state of the latch output signals when supply of the electric power to the latch circuit from the power supply line is cut off.

Preferably, the first output state of the latch output signal means a high level. The second output state means a low level. The momentary switch switches a state of connection between a predetermined switch contact portion and a ground from a cut-off state to a conductive state only when an operational force is applied to the momentary switch. The latch circuit has a resistor whose connection portion at one side is electrically connected to the power supply line. The connection portion at other side is electrically connected to the switch contact portion. An electric potential of the connection portion, at the other side, is used as the latch output signal. A PNP transistor has its emitter terminal electrically connected to the connection portion of the resistor at the one side. The base terminal is electrically connected to the connection portion of the resistor at the other side. An NPN transistor has its collector terminal electrically connected to the connection portion of the resistor at the other side. Its base terminal is electrically connected to a collector terminal of the PNP transistor. The NPN transistors emitter terminal is electrically connected to the ground. The reset circuit has a switching element to make the collector terminal of the PNP transistor and the base terminal of the NPN transistor electrically conductive to the ground according to an output of the latch reset signal from the microcomputer. The capacitor is interposed between the connection portion of the resistor at the one side and the ground.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

DETAILED DESCRIPTION OF THE PREFERRED EMBODIMENTS

Figure 1:
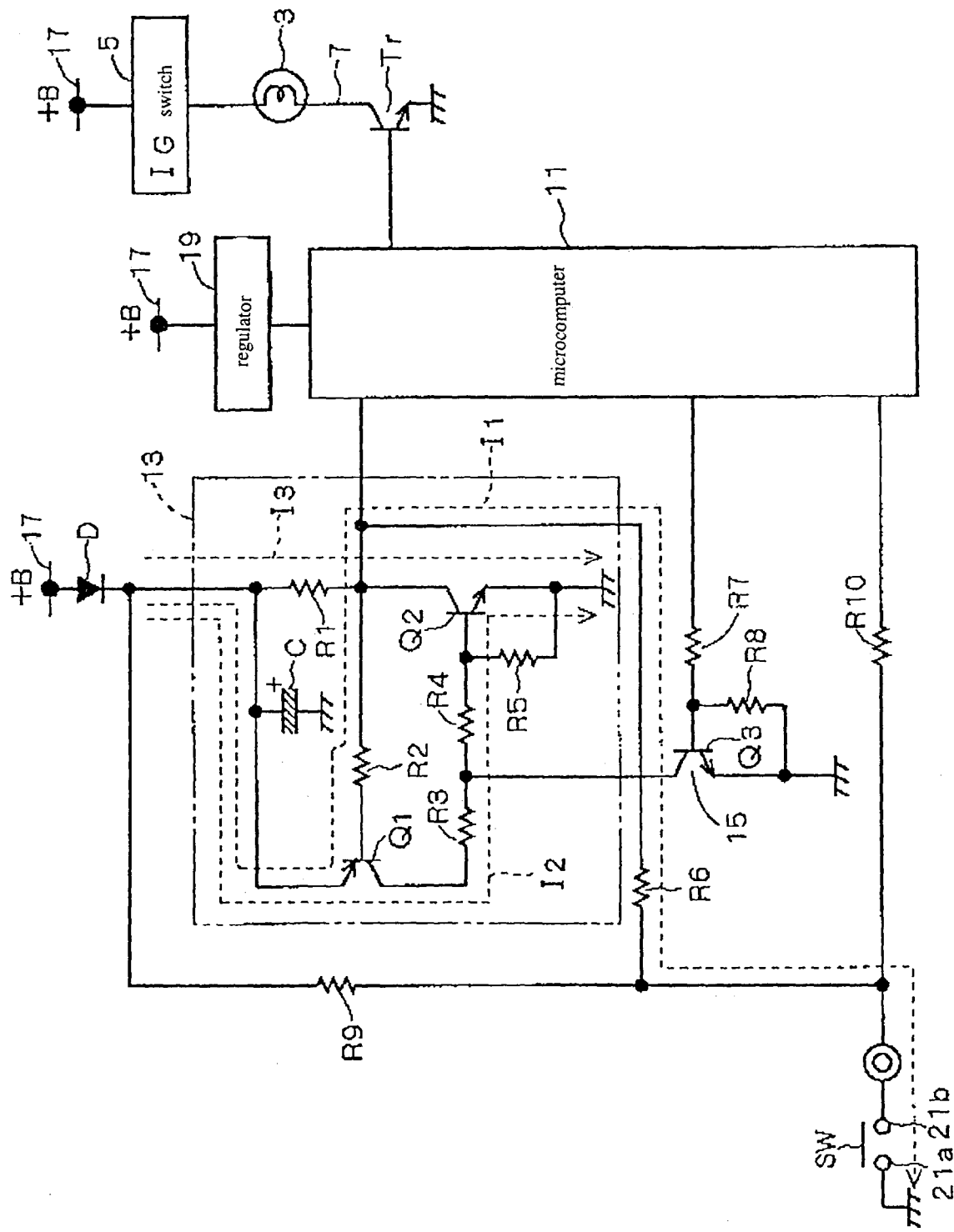
FIG. 1 is a block diagram of a control apparatus according to an embodiment of the present invention.

FIG. 1 is a block diagram of a control apparatus according to an embodiment of the present invention. The control apparatus is used in a vehicle. As shown in FIG. 1, the control apparatus has a momentary switch SW of autonomous return type, a microcomputer 11, a latch circuit 13, a capacitor C, and a reset circuit 15. The control apparatus controls ON and OFF of the rear fog lamp (hereinafter referred to as lamp) 3 according to the operation of the momentary switch (hereinafter referred to as switch) SW. In the embodiment, the capacitor C is accommodated in the latch circuit 13.

The rear fog lamp 3, the transistor Tr, and an ignition switch 5 are mounted in series with a path 7. One end of the path 7 is connected to a power source line and other end is connected to the ground. Thus when the transistor Tr is turned on and off under the control of the microcomputer 101, with the ignition switch ON, the rear fog lamp 3 is turned on and off. The power supply line 17 is connected to a battery not shown in FIG. 1.

As shown in FIG. 1, when an operational force (for example, pressing force) is not applied to the switch SW, contact portions 21a and 21b are cut off. Only when the operational force is applied to the switch SW, do the contact portions 21a and 21b become electrically conductive to each other. When the operational force is released from the switch SW, the contact portions 21a and 21b are again cut off. The contact portion 21a is electrically connected to the ground. Thus, only when the operational force is applied to the switch SW, do the contact portions 21a and 21b become electrically conductive to each other, and the contact portion 21b becomes electrically conductive to the ground.

A voltage supplied from the power supply line 17 is applied to the contact portion 21b through a path having resistors R1 and R6 mounted therein and a path having a resistor R9 mounted therein. A connection portion of each of the resistors R1 and R9 at one end is electrically connected to the power supply line 17 through a diode D. A connection portion of the resistor R1 at its other end is electrically connected to the contact portion 21b through the resistor R6. A connection portion of the resistor R9 at the other end is electrically connected to the contact portion 21b. When the contact portion 21b becomes conductive to the ground as a result of turning-on the switch SW, an electric potential at the contact portion 21b drops from a predetermined potential level to the ground level. The microcomputer 11 receives a change state of the electric potential of the contact portion 21b as an input of a SW normal signal (see FIG. 2) through a resistor R10 to detect whether the switch SW has been operated.

Before the operation of the circuit is described in detail, the operation of the latch circuit 13, the reset circuit 15, and the microcomputer 11 will be described below.

The latch circuit 13 operates based on the electric power supplied from the power supply line 17. When the switch SW is turned on, the latch circuit 13 switches a latch output signal from "high" (first output state) to "low" (second output state) and keeps the latch output signal "low." The capacitor C, electrically connected with the power supply line 17 supplies the latch circuit 13 with electric power when the supply of the electric power from the power supply line 17 to the latch circuit 13 is cut off. In response to a high-level latch reset signal inputted to the reset circuit 15 from the microcomputer 11, the reset circuit 15 sends a signal to the latch circuit 13 so that the latch circuit 13 switches the latch output signal to "high" from "low".

The microcomputer 11 operates based on the electric power supplied to it from the power supply line 17 through a regulator 19. When the microcomputer 11 detects that the switch SW has been turned on because of the input of the SW normal signal, and if the latch output signal sent from the latch circuit 13 has the high level, the microcomputer 11 switches the control state of the lamp 3 from an OFF state (first control state) to an ON state (second control state) through a transistor Tr. When the microcomputer 11 detects that the switch SW has been turned on because of the input of the SW normal signal, and if the latch output signal has the low level, the microcomputer 11 switches the control state of the lamp 3 from the ON state to the OFF state and outputs the high-level latch reset signal to the reset circuit 15.

After the construction of the latch circuit 13 and the reset circuit 15 are described, the operation of the control apparatus will be described below.

As shown in FIG. 1, the latch circuit 13 has capacitor C, the resistors R1 through R5, a PNP transistor Q1, and an NPN transistor Q2. The electric potential of the connection portion of the resistor R1 at the other side is outputted to the microcomputer 11 as the latch output signal.

The capacitor C is interposed between the connection portion of the resistor R1 at the one side and the ground. The capacitor C stores electric power supplied to it from the power supply line 17 through the diode D.

An emitter terminal of the transistor Q1 is electrically connected to the connection portion of the resistor R1 at the one side. A base terminal of the transistor Q1 is electrically connected to the connection portion of the resistor R1 at the other side through the resistor R2.

A collector terminal of the transistor Q2 is electrically connected to the connection portion of the resistor R1 at the other side. A base terminal of the transistor Q2 is electrically connected to a collector terminal of the transistor Q1 through the resistors R3 and R4. An emitter terminal of the transistor Q2 is electrically connected to ground. The resistor R5 is connected between the base terminal of the transistor Q2 and the emitter terminal.

As shown in FIG. 1, the reset circuit 15 has a transistor (switching element) Q3 and resistors R7 and R8. A collector terminal of the transistor Q3 is electrically connected to a connection portion between the resistors R3 and R4 of the latch circuit 13. A base terminal of the transistor Q3 is electrically connected to the microcomputer 11 through the resistor R7. An emitter terminal of the transistor Q3 is electrically connected to ground. The resistor R8 is connected between the base terminal of the transistor Q3 and the emitter terminal.

Figure 2:
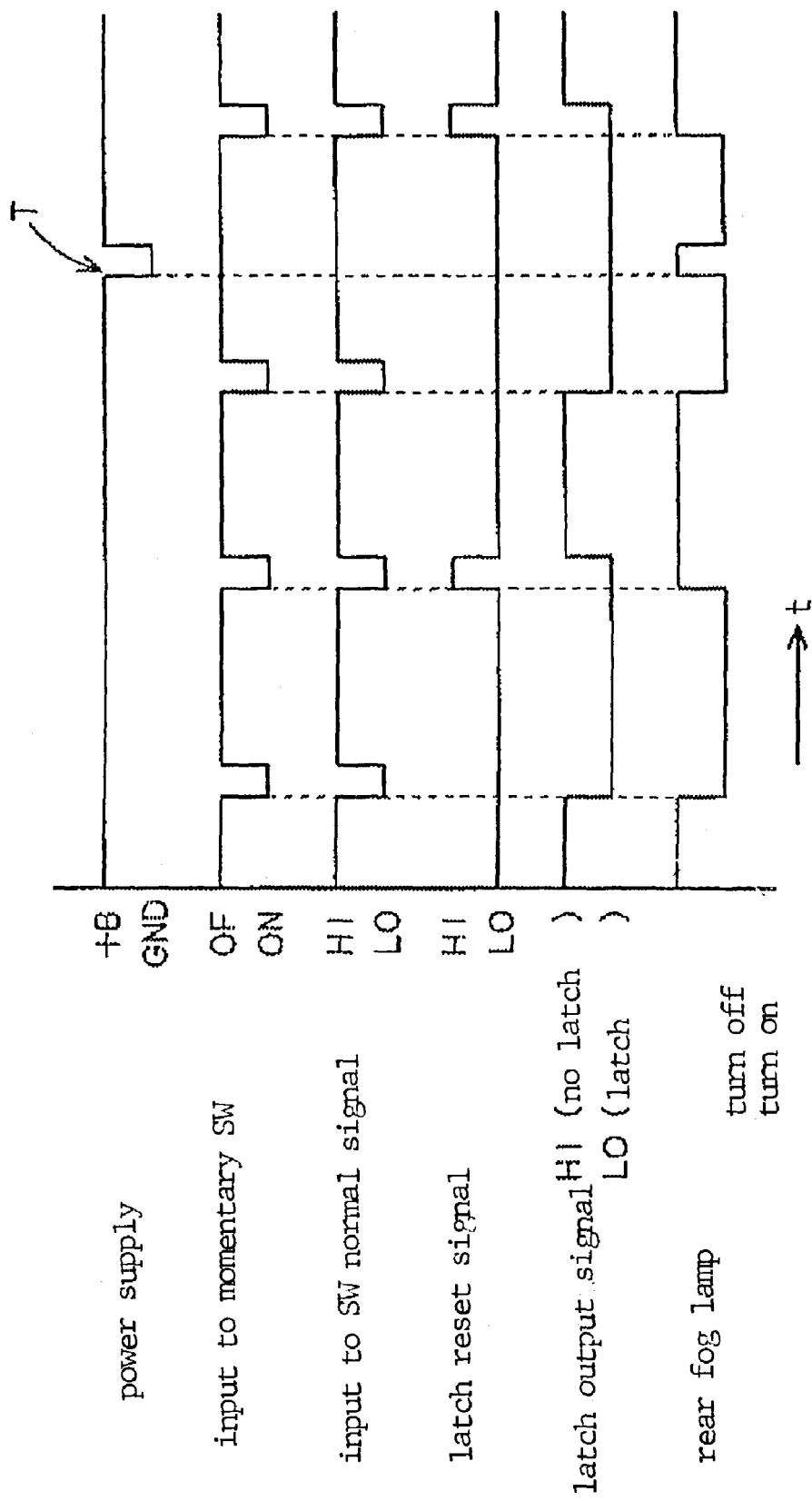
FIG. 2 is a timing chart to explain the operation of the control apparatus of FIG. 1.

In a state where the control apparatus has the above-described circuit construction, it is electrically connected with the power supply line 17. At the start of the supply of the electric power to the control apparatus (the latch circuit 13 and the microcomputer 11) from the power supply line 17, the switch SW is not turned on, and the contact portion 21*b* of the switch SW and the connection portion of the resistor R1 at the other side are not electrically connected to ground. Thus as shown in FIG. 2, the latch output signal (no latch) of a high level and the SW normal signal of a high level are inputted to the microcomputer 11. In this state, the transistor Tr is turned off, the lamp 3 is turned off, and the latch reset signal is held at a low level.

The control apparatus is not provided with a power switch. When the control apparatus is mounted on a vehicle, in principle, the electric power is always supplied from the power supply line 17. When the supply of the electric power starts and the microcomputer 11 starts an operation, the microcomputer 11 determines whether there is a latch state in the latch circuit 13, based on the output state (high or low) of the latch output signal. More specifically, when the latch output signal has the high level at the time of the start of the operation of the microcomputer 11, the microcomputer 11 determines that there is no latch and holds the transistor Tr in an OFF state to hold the turn-off state of the lamp 3. On the other hand, when the latch output signal has the low level at the start time of the operation of the microcomputer 11, it determines that there is a latch and switches the transistor Tr from OFF to ON to turn on the lamp 3.

Let it be supposed that the switch SW is turned on (first-time operation) in the state where the high-level latch output signal is inputted to the microcomputer 11. As a result, the contact portion 21*b* becomes conductive to ground, and the SW normal signal is switched from the high level to the low level. At this time, the microcomputer 11 determines that the switch SW has been turned on as the first-time operation and turns on the transistor Tr to turn on the lamp 3.

Because the contact portion 21*b* becomes conductive to ground as a result of turn-on of the switch SW, the connection portion of the resistor R1 at the other side becomes conductive to ground through the resistor R6 and the switch SW. Thus, the latch output signal switches from the high level to the low level. An electric current I1 flows to ground sequentially in the order of the power supply line 17, the diode D, the transistor Q1, the resistors R2 and R6, and the switch SW, as shown in FIG. 1, and the transistor Q1 is turned on.

When the transistor Q1 is turned on, an electric current I2 flows to the ground sequentially in the order of the power supply line 17, the diode D, the transistor Q1, the resistors R3 and R4, and the transistor Q2. As a result, the transistor Q2 is turned on.

Figure 3:
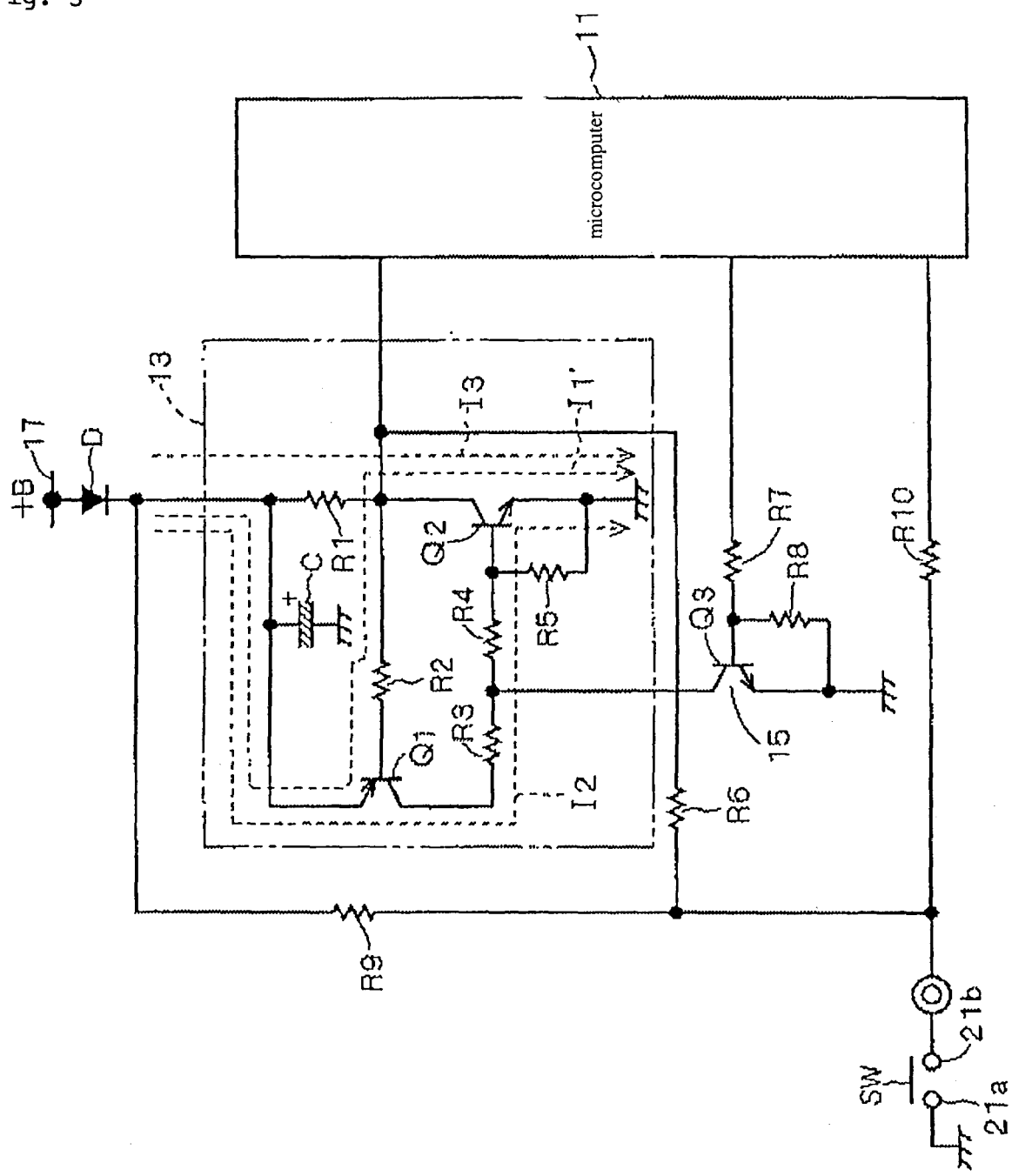
FIG. 3 is a block diagram of the operation of the control apparatus of FIG. 1.

When the transistor Q2 is turned on, an electric current I3 flows to ground sequentially in the order of the power supply line 17, the diode D, the resistor R1, and the transistor Q2, and the path through which the electric current I1 flows changes, as shown with a reference symbol I1' in FIG. 3. Thus, the electric current I1', which has changed its path, flows to ground sequentially in the order of the power supply line 17, the diode D, the transistor Q1, the resistor R2, and the transistor Q2. Even after the contact portion 21*b* is cut off from the ground as a result of turn-off of the switch SW, the electric current I1' keeps flowing so long as the transistor Q2 is not turned off.

FIG. 3 shows the state of the electric current flowing through the circuit when the switch SW is turned off in the first-time operation. As shown in FIG. 3, as long as the electric current I1' continues to flow, the transistor Q1 is held in the ON state, and the flow state of the electric current I2 is held. Thus, the transistor Q2 is also held in the ON state. Consequently the flow state of the electric currents I1' and I3 is held. Consequently the latch output signal is held in the low level (latch state). When the switch SW is turned off and the contact portion 21*b* is cut off from ground, the SW normal signal switches from the low level to the high level.

Let it be supposed that the switch SW is turned on at a second time in the state where the low-level latch output signal is inputted to the microcomputer 11. As a result, the contact portion 21*b* becomes conductive to ground. The SW normal signal is switched from the high level to the low level. At this time, the microcomputer 11 determines that the switch SW has been turned on as the second-time operation and turns off the transistor Tr to turn off the lamp 3.

At this time, the microcomputer 11 switches the latch output signal from the low level to the high level to release the latch state of the latch circuit 13 only a time period between the time when the switch SW is turned on at the second time and the time when the switch SW is turned off. The time periods between the time when the SW normal signal switches from the low level to the high level and the time when the SW normal signal switches from the high level to the low level. Thus, as shown in FIG. 4, an electric current I4 flows to ground sequentially in the order of the microcomputer 11, the resistor R7, and the transistor Q3, and the transistor Q3 is turned on.

Figure 4:
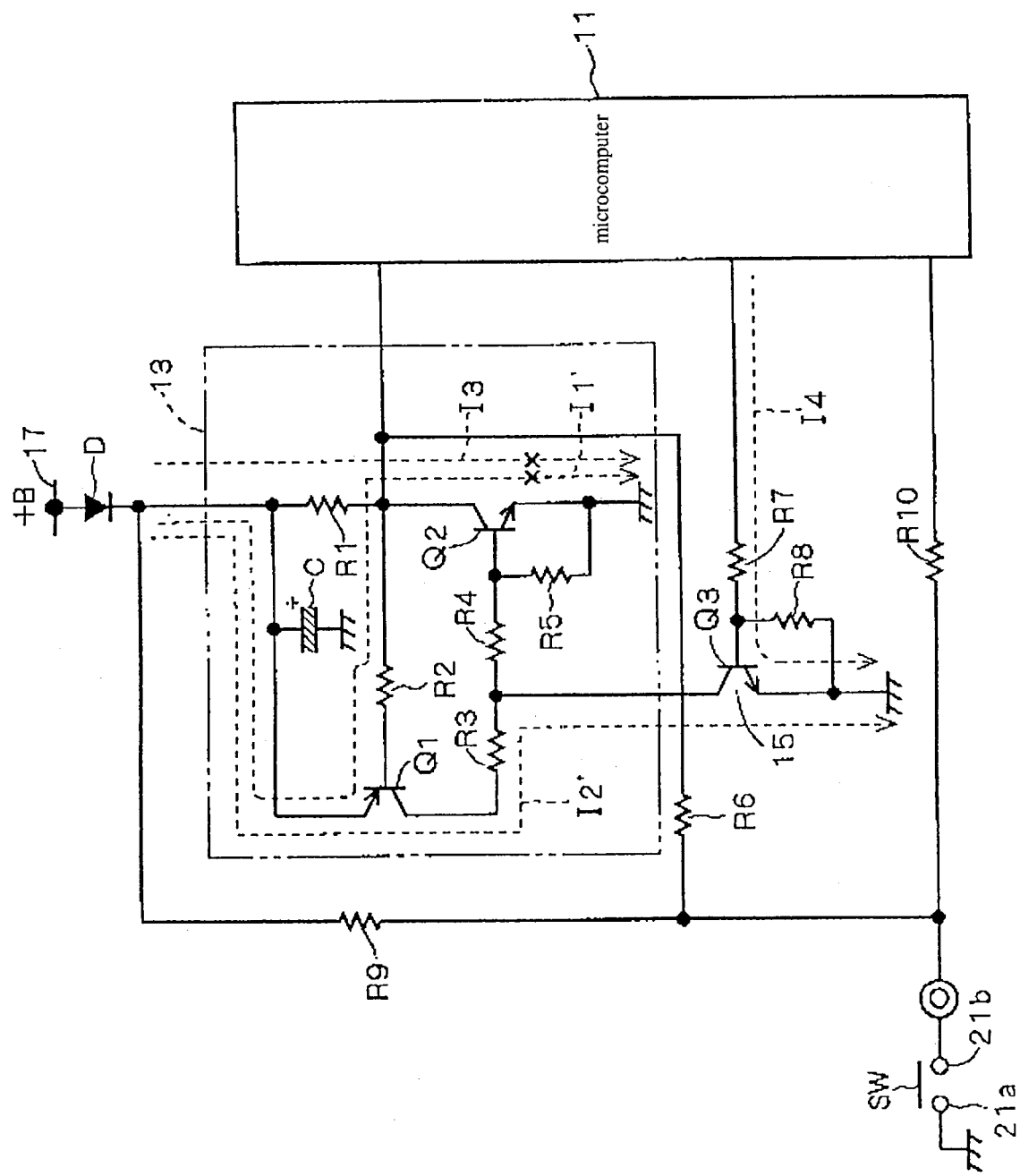
FIG. 4 is a block diagram of the operation of the control apparatus of FIG. 1.

When the transistor Q3 is turned on, the path through which the electric current I2 flows changes, as shown with reference symbol I2' in FIG. 4. That is, the electric current I2', which has changed its path, flows to ground sequentially in the order of the power supply line 17, the diode D, the transistor Q1, the resistor R3, and the transistor Q3. Thus, the transistor Q2 is turned off. As a result, the flow of each of the electric currents I1' and I3 stops. Also, transistor Q1 is turned off.

The ON state of the transistor Q3 is held until the contact portion 21*b* is cut off from ground as a result of a second-time turn-off of the switch SW. At the second-time turn-off of the switch SW, the latch output signal switches from the low level to the high level. Accordingly, the latch state of the latch circuit 13 is released.

Thereafter, in a normal state where the supply of electric power to the control apparatus is not stopped, the above-described operation is repeated according to the first-time operation (odd-numbered times) and the second-time operation (even-numbered times) for the switch SW.

Figure 5:
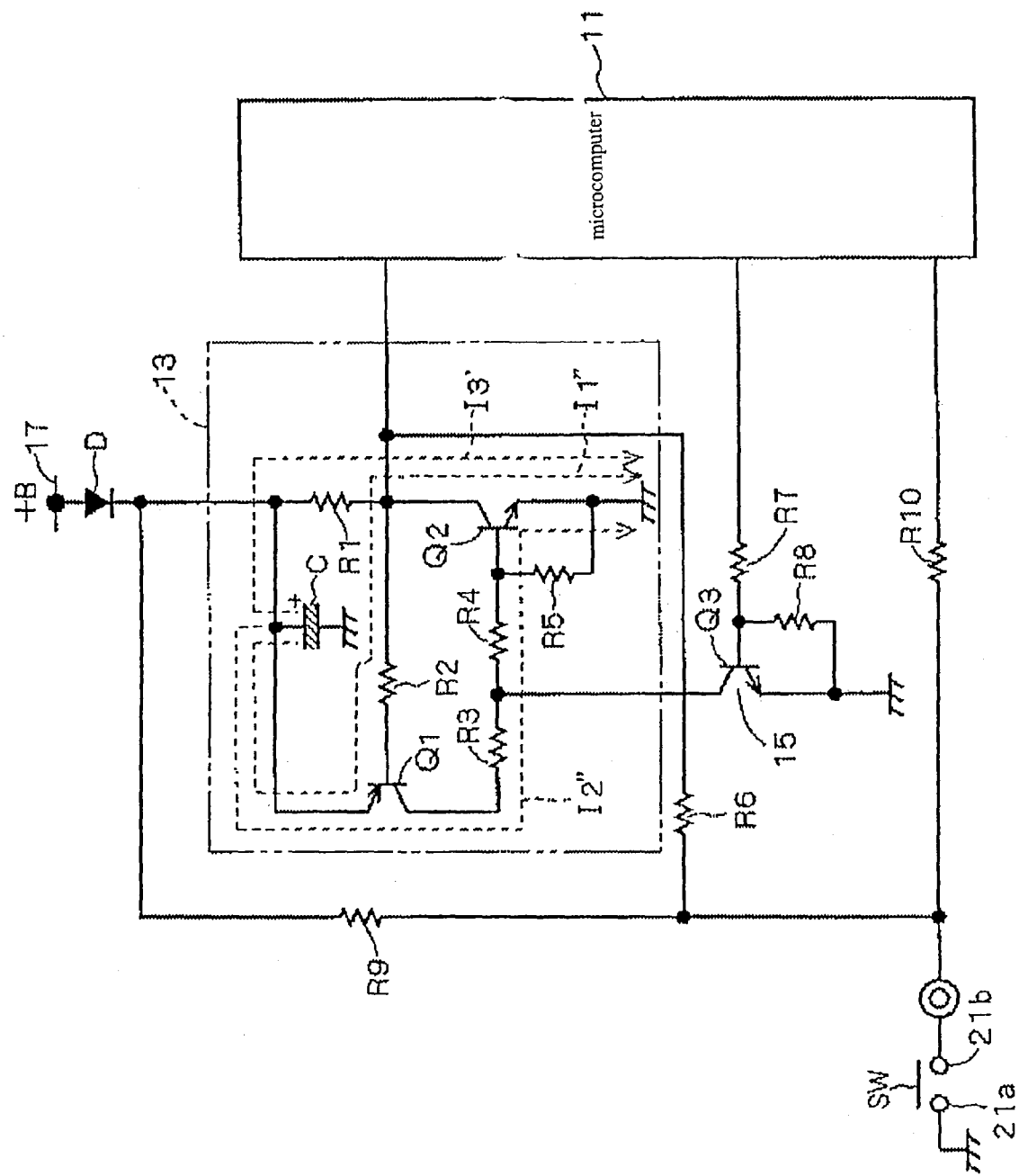
FIG. 5 is a block diagram of the operation of the control apparatus of FIG. 1.
Figure 6:
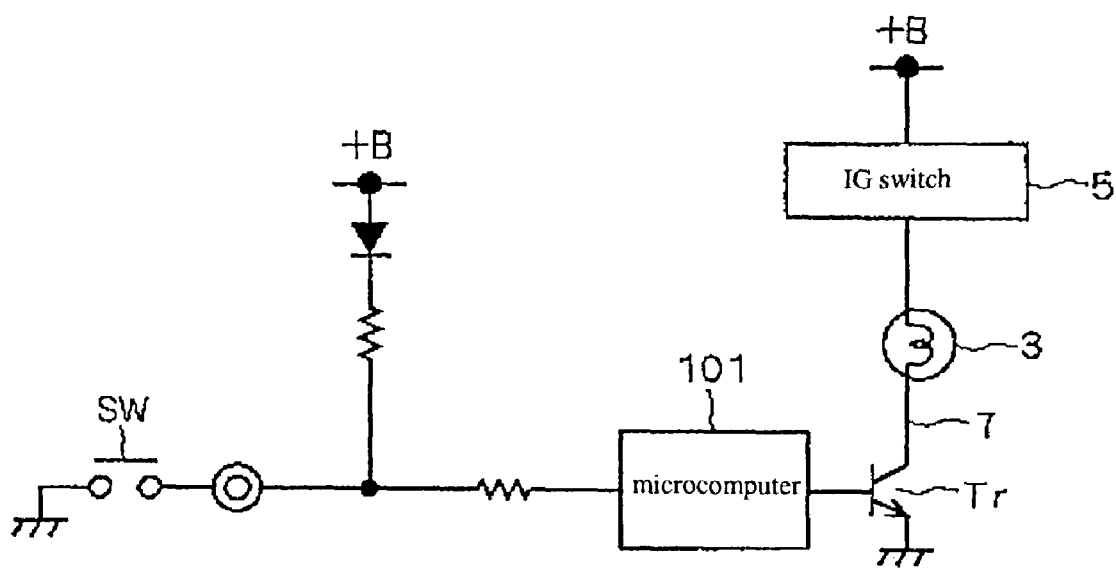
FIG. 6 is a block diagram of a conventional control apparatus.
Figure 7:
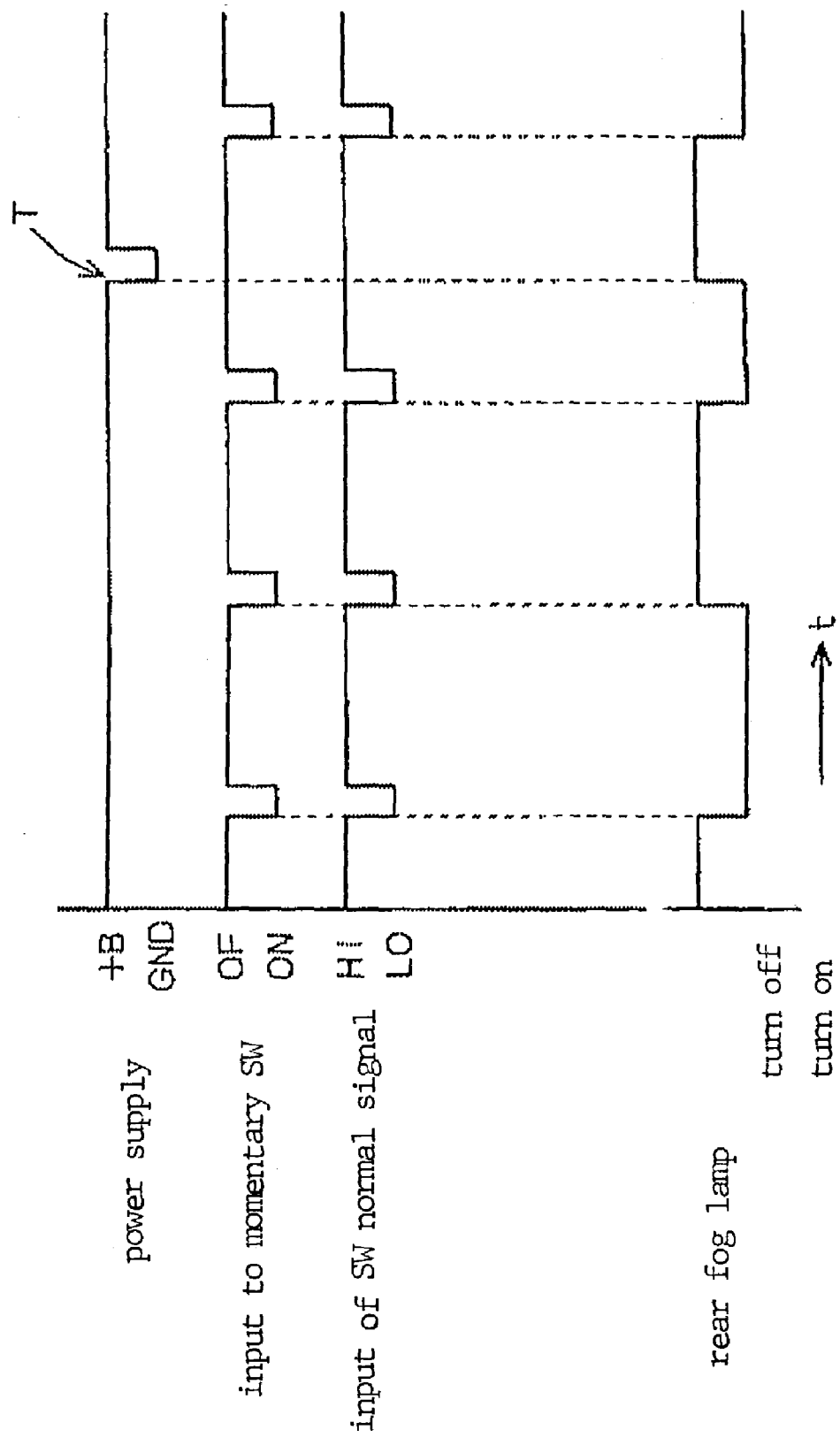
FIG. 7 is a timing chart to explain the operation of the control apparatus of FIG. 6.

Description is made on the operation of the case where the supply of electric power from the power supply line 17 to the microcomputer 11 and to the latch circuit 13 is stopped. As shown in FIG. 2, in the case where the supply of electric power to the microcomputer 11 and to the latch circuit 13 is stopped or interrupted temporarily (or instantaneously) at a time T in the state between the time when the switch SW is turned on at the first time and the time when the switch SW is turned off at the second time, namely, in the state where the transistor Tr is turned on to turn on the lamp 3 under the control of the microcomputer 11, the path of the electric currents I1', I2, and I3 (see FIG. 3), which flow through the latch circuit 13, change as shown with reference symbols I1", I2", and I3', respectively (see FIG. 5.) The electric currents I1", I2", and I3', which have changed flow paths are supplied from the capacitor C. The latch state, the state in which the latch output signal is held in the low level, of the latch circuit 13 is held by the electric currents I1", I2", and I3' until the supply of the electric power is resumed or until the time when an accumulated amount of the capacitor C is exhausted.

When the supply of electric power from the power supply line 17 to the microcomputer 11 and to the latch circuit 13 is resumed and the microcomputer 11 resumes operation, the latch output signal is held at the low level. Thus, the microcomputer 11 determines that there is a latch and switches the transistor Tr from OFF to ON to keep the turn-on state of the lamp 3 (i.e. to turn on the lamp 3 which has been turned off by the OFF of the transistor Tr).

Thus, when the supply of the electric power from the power supply line 17 to the microcomputer 11 is temporarily stopped or interrupted and resumed in the state where the lamp 3 is turned on, the lamp 3 is restored to the ON state, even though a user does not operate the switch SW.

When the supply of the electric power to the microcomputer 11 and to the latch circuit 13 is interrupted or stopped temporarily (or instantaneously) before the supply of the electric power is resumed, in the state between the time when the switch SW is turned on at the second time and the time when the switch SW is turned off at a subsequent first time, namely, in the state where the transistor Tr is turned off to turn off the lamp 3 under the control of the microcomputer 11, the latch output signal is held at the high level. Accordingly, the latch circuit 13 is held in a latch-released state due to the electric power supplied by the capacitor C. Thus, the transistor Tr and the lamp 3 are held in the OFF state.

According to the invention, the latch output signal of the latch circuit is switched from the first output state to the second output state. The second output state is held when the momentary switch is operated. The output state of the latch circuit is held by the electric power supplied from the capacitor, even when the supply of the electric power from the power supply line is stopped. Based on the output state of the latch output signal, the microcomputer recognizes whether a first operation or a second operation has been performed on the momentary switch. If the microcomputer determines that the second operation has been performed on the momentary switch, the output signal of the latch circuit is reset to the first output state from the second output state through the reset circuit. Thus, even if the supply of the electric power to the microcomputer is stopped, the state set by operating the momentary switch can be held by the simple circuit construction. Accordingly, when the supply of the electric power to the microcomputer from the power supply line is interrupted or stopped temporarily (or instantaneously), the control state of the to-be-controlled object can be held in the second control state. According to the invention, the latch circuit can be composed with a simple construction.

While the above description of the invention is merely exemplary in nature and, thus, variations that do not depart from the gist of the invention are intended to be within the scope of the invention. Such variations are not to be regarded as a departure from the spirit and scope of the invention.

What is claimed is:

1. A control apparatus for alternately switching a control state of an object between a first control state and a second control state in response to an operation on a momentary switch, comprising:

a momentary switch;

a latch circuit that operates based on electric power supplied from a power supply line to switch a latch output signal from a first output state to a second output state, said latch circuit holding said second output state in response to said operation performed on said momentary switch;

a reset circuit that sends a signal to said latch circuit in response to an input of a latch reset signal so that said latch circuit switches said latch output signal from said second output state to said first output state;

a microcomputer that operates based on said electric power supplied from said power supply line so that if said latch output signal has said first output state when said momentary switch is operated, said microcomputer switches said control state of said object from said first control state to said second control state, and if said latch output signal has said second output state when said momentary switch is operated, said microcomputer switches said control state of said object from said second control state to said first control state, and said microcomputer outputs said latch reset signal to said reset circuit; and a capacitor electrically connected to said power supply line, said capacitor supplying an electric power to said latch circuit to hold an output state of said latch output signal when a supply of said electric power to said latch circuit from said power supply line is cut off;

wherein said momentary switch switches a state of connection between a predetermined switch contact portion and a around from a cut-off state to a conductive state only when an operational force is applied to said momentary switch and wherein said latch circuit has a resistor with connection portion at one side electrically connected to said power supply line, and a connection portion at its other side electrically connected to said switch contact portion, and an electric potential of said connection portion at said other side is used as said latch output signal.

2. The control apparatus according to claim 1, wherein said latch circuit includes a PNP transistor with an emitter terminal electrically connected to said connection portion of said resistor at said one side and a base terminal electrically connected to said connection portion of said resistor at said other side.

3. The control apparatus according to claim 2, wherein said latch circuit includes an NPN transistor with a collector terminal electrically connected to said connection portion of said resistor at said other side, a base terminal electrically connected to a collector terminal of said PNP transistor, and an emitter terminal electrically connected to said ground.

4. The control apparatus according to claim 3, wherein said reset circuit includes a switching element for making said collector terminal of said PNP transistor and said base terminal of said NPN transistor electrically conductive to said ground according to an output of said latch reset signal from said microcomputer.

5. The control apparatus according to claim 1, wherein said capacitor is interposed between said connection portion of said resistor at said one side and said ground.

6. The control apparatus according to claim 1, wherein said first output state of said latch output signal is a high level, and said second output state is a low level.

* * * * *